US009075096B2

(12) United States Patent
Hironaka

(10) Patent No.: US 9,075,096 B2
(45) Date of Patent: Jul. 7, 2015

(54) COLLISION DETECTION DEVICE FOR VEHICLE

(75) Inventor: Ryouji Hironaka, Gamagoori (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 58 days.

(21) Appl. No.: 14/115,520

(22) PCT Filed: May 12, 2011

(86) PCT No.: PCT/JP2011/060948
§ 371 (c)(1),
(2), (4) Date: Nov. 4, 2013

(87) PCT Pub. No.: WO2012/153417
PCT Pub. Date: Nov. 15, 2012

(65) Prior Publication Data
US 2014/0077826 A1 Mar. 20, 2014

(51) Int. Cl.
*G01R 27/26* (2006.01)
*B60L 3/00* (2006.01)
(Continued)

(52) U.S. Cl.
CPC ........... *G01R 27/2605* (2013.01); *B60L 3/0007* (2013.01); *B60R 21/0136* (2013.01); *G01P 15/06* (2013.01); *G01P 15/0891* (2013.01); *G01P 15/125* (2013.01); *B60L 3/04* (2013.01); *B60W 20/50* (2013.01); *B60L 3/003* (2013.01); *B60L 3/0069* (2013.01); *B60L 11/123* (2013.01); *B60L 11/14* (2013.01); *B60L 15/007* (2013.01); *B60L 15/20* (2013.01); *B60L 2210/10* (2013.01); *B60L 2210/40* (2013.01); *B60L 2240/421* (2013.01); *B60L 2270/20* (2013.01); *B60L 2240/527* (2013.01); *Y02T 10/7077* (2013.01); *Y02T 10/7241* (2013.01); *Y02T 10/7022* (2013.01); *Y02T 10/7216* (2013.01);
(Continued)

(58) Field of Classification Search
CPC ......... H02J 9/061; H02J 7/345; G01P 15/125; B60R 21/0176; B60W 20/50; G01R 27/2605; H03K 5/26; Y02T 10/6217; Y02T 10/642; Y02T 10/7275; B60L 3/003; B60L 3/0069; B60L 2210/10; B60L 2210/40; B60L 2240/421; B60L 11/123; B60L 11/14; B60L 15/007; B60L 15/20
See application file for complete search history.

(56) References Cited

U.S. PATENT DOCUMENTS

2004/0226377 A1\* 11/2004 Tsugai ...................... 73/514.32
2006/0219536 A1\* 10/2006 Tay Eng Hock et al. .. 200/61.45 R (Continued)

FOREIGN PATENT DOCUMENTS

JP 06-213924 8/1994
JP 2007-155700 6/2007

(Continued)

*Primary Examiner* — Vinh Nguyen
(74) *Attorney, Agent, or Firm* — Sughrue Mion, PLLC

(57) ABSTRACT

A collision detection device for a vehicle detects a collision to the vehicle from any direction. Smoothing capacitors (510, 520) and an inverter are housed within a case (10). Electrode bus bars (12, 14) are connected to the positive electrode plates and negative electrode plates of the smoothing capacitors (510, 520). The smoothing capacitors (510, 520) are caused to protrude toward the inner surface of the case (10) from the periphery of the smoothing capacitors (510, 520), and the ends of the electrode bus bars (12, 14) are caused to face the inner surface of the case (10). The occurrence of a collision is detected by detecting the short-circuiting or grounding of the electrode bus bars (12, 14).

11 Claims, 12 Drawing Sheets

(51) Int. Cl.
- *G01P 15/06* (2006.01)
- *G01P 15/08* (2006.01)
- *G01P 15/125* (2006.01)
- *B60L 3/04* (2006.01)
- *B60W 20/00* (2006.01)
- *B60L 11/12* (2006.01)
- *B60L 11/14* (2006.01)
- *B60L 15/00* (2006.01)
- *B60L 15/20* (2006.01)
- *B60R 21/0136* (2006.01)

(52) U.S. Cl.
CPC ........... *Y02T 10/6217* (2013.01); *Y02T 10/642* (2013.01); *Y02T 10/7275* (2013.01)

(56) References Cited

U.S. PATENT DOCUMENTS

| | | |
|---|---|---|
| 2007/0102220 A1 | 5/2007 | Kiribayashi |
| 2007/0246333 A1 | 10/2007 | Kawaura et al. |
| 2008/0134782 A1 | 6/2008 | Kuttenberger et al. |
| 2008/0216572 A1* | 9/2008 | Aoyama .................... 73/514.32 |
| 2009/0014228 A1 | 1/2009 | Kawaura et al. |
| 2009/0143933 A1 | 6/2009 | Kawaura et al. |
| 2010/0200377 A1 | 8/2010 | Arakawa |
| 2011/0115038 A1* | 5/2011 | Kanemoto .................... 257/418 |
| 2013/0147498 A1 | 6/2013 | Hironaka |

FOREIGN PATENT DOCUMENTS

| | | |
|---|---|---|
| JP | 2007-526841 | 9/2007 |
| JP | 2007-292593 | 11/2007 |
| JP | 2008-154315 A | 7/2008 |
| JP | 2008-207629 | 9/2008 |
| JP | 2009-143518 | 7/2009 |
| JP | 2010-071858 | 4/2010 |
| JP | 2010-148296 A | 7/2010 |
| JP | 2010-183803 A | 8/2010 |
| WO | 2012/143987 A1 | 10/2012 |

* cited by examiner

COLLISION DETECTION DEVICE FOR VEHICLE

TECHNICAL FIELD

The present invention relates to a collision detection device for a vehicle, and more particularly to a collision detection device for a vehicle using a case containing an electrical apparatus such as an inverter.

BACKGROUND ART

In a hybrid vehicle, electric vehicle, fuel cell vehicle, etc., an electrical apparatus such as an inverter is operated with electrical power from a high-voltage power supply to thereby run the vehicle, and therefore, if the vehicle receives a severe impact caused by a collision, etc., and if the level of the impact exceeds the breaking strength of the electrical apparatus, the apparatus may be damaged, and depending on the degree of damage of its electrical system, high-voltage electrical power may be leaked. In order to prevent such a situation, it is necessary to immediately detect a vehicle collision, cut off power supply from a power source at the time of the collision, and immediately discharge electric charge accumulated in a high-voltage capacitor.

The below-listed Patent Document 1 discloses a structure in which a conductive film is extended throughout the inner surface of a lid of a case containing an inverter, and the conductive film is electrically disconnected when the lid is deformed. An ECU detects a current value I flowing through the conductive film and judges whether the current value I is approximately zero or not. Then, if it is approximately zero, the ECU judges that the inverter has received an impact and turns off a system main relay, in order to cut off power supply from a running battery. The ECU also stops the inverter so as to put a motor-generator into an inactive state where it cannot generate electrical power.

CITATION LIST

Patent Documents

Patent Document 1: JP 2008-154315 A

SUMMARY OF INVENTION

Technical Problem

Although the structure in which the conductive film is extended throughout the inner surface of the lid of the case containing an electrical apparatus such as the inverter is effective as a technique for detecting deformation of the lid caused by a collision, this requires a separate process of forming the conductive film as a component dedicated for detecting deformation. Therefore, in order to detect an impact by detecting the deformation of the case, it is desirable that the impact can be detected without increasing the number of processes and without increasing the number of parts of dedicated components.

Further, a collision may fail to be detected in a type of collision where the inner surface of the lid of the inverter case is not damaged; that is, for example, a type of collision where only a top of the inverter case is damaged. Although, it is of course possible to extend the conductive film in all directions of the inverter case, costs and manufacturing processes will increase accordingly.

Further, depending on the state of damage in the wiring of conductor patterns and the inverter case, there may be a case where an electrical current flowing through the conductive film does not become zero. That is, for example, a case where adjacent conductor patterns are short-circuited to each other, or a case where a conductive pattern contacts the inverter case and has an earth fault. In these cases, collision may fail to be detected.

The objective of the present invention is to provide a device which can detect a collision by reliably detecting deformation of a case containing an electrical apparatus such as an inverter, the deformation being caused by an impact from any direction, without increasing the number of parts unnecessarily.

Solution to Problem

The present invention is a collision detection device for a vehicle which includes a capacitor, a case which contains the capacitor, electrode bus bars which are connected to electrode plates of the capacitor and protrude from a periphery of the capacitor to face an inner surface of the case, and a control unit which detects a voltage change in the electrode bus bars, thereby detecting a collision.

In the present invention, electrode bus bars are connected to plates (electrode plates) of a capacitor, and ends of the bus bars are extended so as to face the inner surface of the case. When the case is deformed by an impact at the time of collision, the inner surface of the case contacts the electrode bus bars, and voltage of the electrode bus bars changes from a normal state (when the electrode bus bars face the inner surface of the case, but do not contact it). By detecting such a voltage change in the electrode bus bars, occurrence of the collision is detected. Because the electrode bus bars are formed to protrude from the periphery of the capacitor, even if a collision occurs from an arbitrary direction, a voltage change arises in the electrode bus bars, and the collision is detected.

According to one embodiment of the present invention, the electrode bus bars are connected to at least one of a positive plate and a negative plate of the capacitor. That is, in the present invention, first, the electrode bus bars are connected to the positive plate and the negative plate of the capacitor, respectively. The electrode bus bars connected to the positive plate are positive electrode bus bars, while the electrode bus bars connected to the negative plate are negative electrode bus bars. In this case, types of voltage changes caused by the collision include a voltage change due to a short circuit between the positive electrode bus bars and the negative electrode bus bars, and a voltage change due to an earth fault in at least one of the positive electrode bus bar and the negative electrode bus bar, and, in the present invention, the collision is detected by detecting one of these voltage changes. In the present invention, second, the electrode bus bars are connected to one of the positive plate or the negative plate of the capacitor. In this case, types of voltage changes caused by the collision include a voltage change due to an earth fault of the positive electrode bus bar or an earth fault of the negative electrode bus bar, and, in the present invention, the collision is detected by detecting one of these voltage changes.

According to another embodiment of the present invention, a metal frame which is contained in the case and surrounds the periphery of the capacitor is further provided, and the electrode bus bar faces the inner surface of the case with the metal frame therebetween. When the case is deformed by an impact at the time of collision, the inner surface of the case contacts the metal frame, and the metal frame contacts the electrode bus bar, thereby changing voltage of the electrode bus bar from a normal state. Therefore, by detecting such a voltage change in the electrode bus bar, an occurrence of a collision is detected.

Advantageous Effects of Invention

With the present invention, it is possible to detect a collision by reliably detecting deformation of a case containing electrical apparatus such as an inverter, the deformation being caused by an impact from any direction, without increasing the number of parts unnecessarily. Further, with the present invention, it is possible to accurately distinguish whether the impact is caused by the collision or other causes.

DESCRIPTION OF EMBODIMENTS

Embodiments of the present invention will now be described below based on the drawings, taking a hybrid vehicle as an example. It should be noted that the present invention is not limited to a hybrid car, but is similarly applicable to any vehicle that runs by controlling electrical power from a battery using an electrical apparatus such as an inverter, and driving a motor.

1. Overall Configuration of the System

Figure 1:
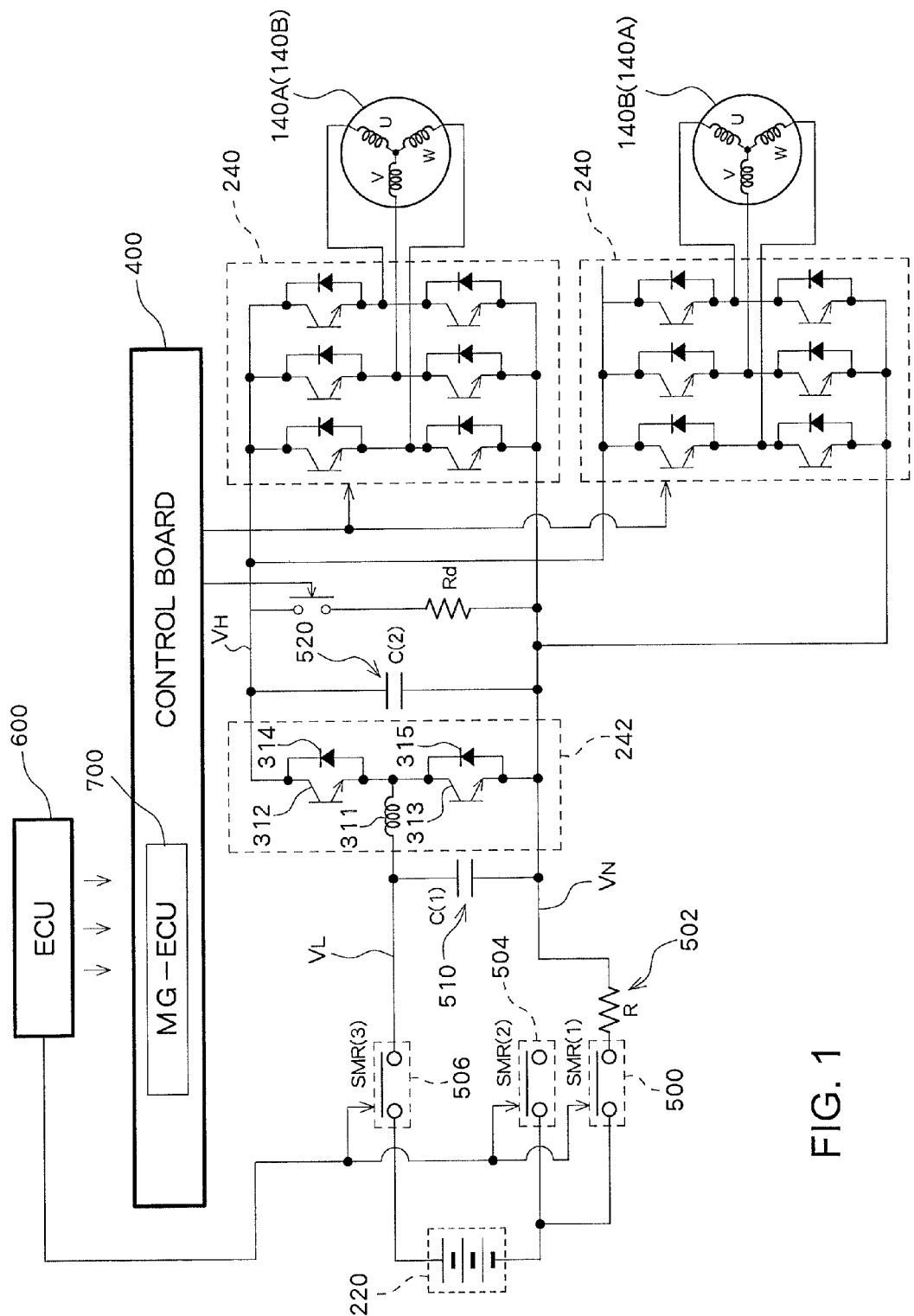
FIG. 1 shows a circuit configuration diagram of an embodiment of the present invention.

First, the overall configuration of the system will be described. The overall configuration of the system is basically identical to the system configuration disclosed in Patent Document 1. FIG. 1 shows this system configuration.

The system includes a running battery 220, a boost converter 242, an inverter 240, capacitors 510 and 520, system main relays SMR 500, 504, and 506, a limiting resistor 502, an ECU 600, and a control board 400.

The inverter 240 includes six IGBTs (Insulated Gate Bipolar Transistors), and six diodes respectively connected in parallel to the IGBTs so that current flows from the emitter side to the collector side of each of the IGBTs. The inverter 240 causes the motor-generator 140 to function as a motor or a generator based on a control signal from the control board 400; more specifically, a control signal from an MG-ECU 700 in the control board 400, based on an instruction from the ECU 600. When causing the motor-generator 140 to function as a motor, the inverter 240 turns on/off the gates of the IGBTs, converts DC power supplied from the running battery 220 to AC power, and supplies the power to the motor-generator 140. When causing the motor-generator 140 to function as a generator, the inverter 240 turns on/off the gates of the IGBTs, converts AC power generated by the motor-generator 140 to DC power, and charges the running battery 220. The motor-generator 140 is composed of a motor-generator 140A and a motor-generator 140B, and when the motor-generator 140A is for drive use, the upper inverter 240 functions as a drive inverter, while when the motor-generator 140B is for electrical power generation use, the lower inverter 240 functions as a power generation inverter.

The boost converter 242 includes a reactor 311, transistors 312 and 313, and diodes 314 and 315. One end of the reactor 311 is connected to a power source line of the running battery 220, while the other end is connected to a middle point between the transistor 312 and the transistor 313. The transistors 312 and 313 are connected in series between the positive electrode side line and the negative electrode side line of the inverter 240. The collector of the transistor 312 is connected to the positive electrode side line, while the emitter of the transistor 313 is connected to the negative electrode side line. Further, the diodes 314 and 315 that cause current to flow from the emitter side to the collector side are connected between the collector and the emitter of the transistors 312 and 313. In the boost converter 242, the transistors 312 and 313 are turned on/off by the control board 400. The boost converter 242 boosts DC power supplied from the capacitor 510 and supplies the resulting power to the capacitor 520. The capacitor 520 smoothes DC power supplied from the boost converter 242 and supplies the smoothed DC power to the inverter 240. As both capacitors 510 and 520 function as smoothing capacitors, the capacitors 510 and 520 will be collectively referred to as smoothing capacitors, when necessary. In addition, for convenience sake, the positive electrode side line before boosting by the boost converter 242 is referred to as a VL line, while the positive electrode side line after boosting by the boost converter 242 is referred to as a VH line. The negative electrode side line is referred to as a VN line.

The ECU 600 controls the inverter 240 and the SMRs 500, 504, and 506 based on an ignition switch, the depression amount of the accelerator pedal, the depression amount of the brake pedal, voltage detected in VH and VL lines, etc.

The boost converter 242, the smoothing capacitors (capacitors 510 and 520), the inverter 240, and the control board 400 are contained in the case as a power control unit (PCU), and the case is stored in the engine compartment or under the rear floor. A high voltage of several hundred volts from the running battery 220 is further boosted by the boost converter 242 and is supplied to the inverter 240.

Therefore, if the vehicle receives a severe impact from a collision, and if the level of the impact exceeds the breaking strength of the case, the case may be damaged, and depending on the degree of damage, high-voltage electrical power from may be leaked from the inverter 240.

Therefore, in the present embodiment, the control board 400 quickly detects the impact caused by the collision and performs processing for immediately stopping operation of the high-voltage system.

Specifically, in the inverter 240, a fast discharge circuit composed of a relay and a discharge resistor Rd is provided between the VH line and the VN line, and the control board 400 outputs an instruction to turn on the relay of the fast discharge circuit, thereby discharging charge accumulated in the smoothing capacitors.

The details of the collision detection structure will be described below.

2. Details of the Collision Detection Structure

The collision detection structure of the present embodiment causes, in the case containing an electrical apparatus such as the inverter 240 and the smoothing capacitors, the bus bars to protrude from the electrode plates of the smoothing capacitors so as to face the case, allows the bus bars and the case to contact each other when the case deforms due to the impact upon the collision, and detects a change in electrical potential in the bus bars, thereby detecting occurrence of a collision. The smoothing capacitor is composed of the positive plate and the negative plate, and the bus bar is caused to protrude from at least one of the positive plate and the negative plate. Because, in a normal state, the bus bars of the capacitor are insulated from the case, potentials of the bus bars; that is, potentials of the smoothing capacitors, are at a certain value. However, when the bus bars contact the case, the potentials of the bus bars become equal to the potential of the case, and if the case is set to be at ground potential, the potentials of the bus bars also become equal to the ground potential. Such a change in the potentials of the bus bars enables detection of contact between the bus bars and the case, and thus occurrence of a collision.

Figure 2:
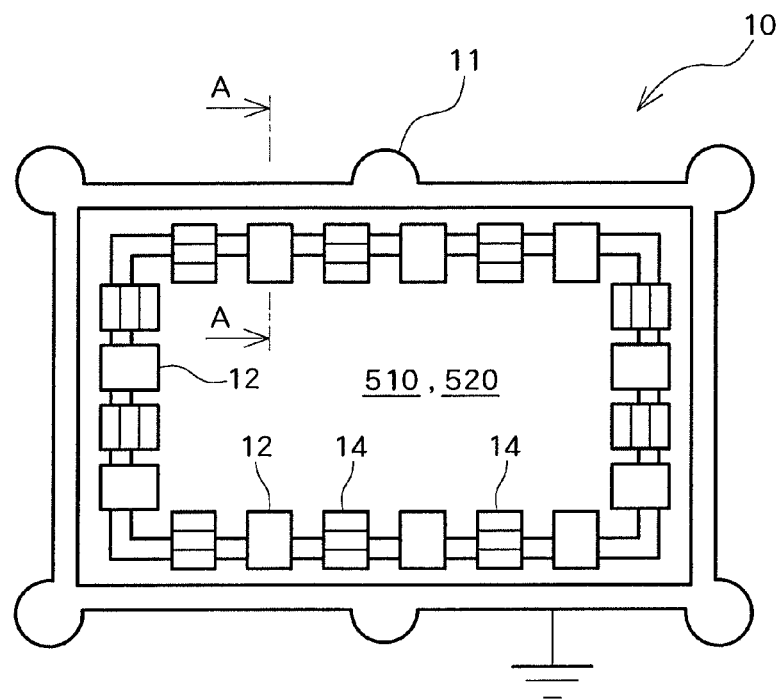
FIG. 2 shows a plan view of a case of the embodiment.

FIG. 2 shows a plan view of a case 10 containing the inverter 240 and the smoothing capacitors 510 and 520. The case 10 has flanges 11 along a periphery thereof and contains, in addition to the smoothing capacitors, the inverter 240, and the smoothing capacitors 510 and 520, the control board 400 on which the MG-ECU 700 is mounted. The case 10 is composed of two case elements such as, for example, an upper case and a lower case, or a lid and a body, and is configured by joining these two case elements to each other through use of a gasket. The case 10 is connected to a body earth of the vehicle through a bracket.

The smoothing capacitor 510 and 520 contained in the case 10 occupy most of the capacity of the case 10. Each of the smoothing capacitors 510 and 520 is composed of a positive plate and a negative plate which face each other and a dielectric body which charges between the two plates. Positive electrode bus bars 12 are formed to protrude from the positive plate, and negative electrode bus bars 14 are formed to protrude from the negative plate. The positive electrode bus bars 12 and the negative electrode bus bars 14 are formed to protrude from the entire periphery of the smoothing capacitor 510 and 520, and the positive electrode bus bars 12 and the negative electrode bus bars 14 are arranged alternately in a plan view such that a negative electrode bus bar 14 is provided adjacent to a positive electrode bus bar 12, and another positive electrode bus bar 12 is located adjacent to that negative electrode bus bar 14. Both positive electrode bus bars 12 and negative electrode bus bars 14 protrude from the smoothing capacitors 510 and 520 to the outside of the capacitor cases of the smoothing capacitors 510 and 520 to face the case 10.

Figure 3:
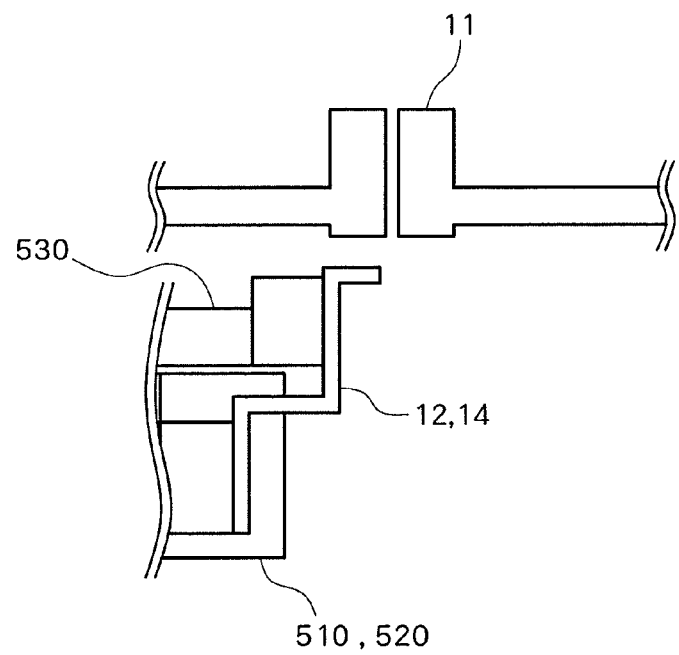
FIG. 3 shows a cross-sectional view of FIG. 2, taken along A-A.

FIG. 3 shows a cross-sectional view of FIG. 2, taken along A-A. The positive electrode bus bars 12 and the negative electrode bus bars 14 are formed to respectively protrude from the positive plates and the negative plates of the smoothing capacitors 510 and 520. Both the positive electrode bus bars 12 and the negative electrode bus bars 14 have a plate-like shape and a curved shape with a plurality of curves, and extend to the outside of the capacitor cases of the smoothing capacitor 510 and 520 in close proximity to the flanges 11 of the case 10. The protruding ends of the positive electrode bus bars 12 and the negative electrode bus bars 14 are curved so as to be approximately parallel to the surfaces of the flanges 11 and face the surfaces of the flanges 11. A gap between the flanges 11 and the positive electrode bus bars 12 and the negative electrode bus bars 14 can be set at any interval to provide insulation therebetween.

In a normal state, the flanges 11 of the case 10 do not contact the positive electrode bus bars 12 or the negative electrode bus bars 14 and are insulated from them. On the other hand, at the time of vehicle collision, the case is deformed by an impact, and the flanges 11 are thus deformed and contact the positive electrode bus bars 12 or the negative electrode bus bars 14.

The structure of the smoothing capacitors 510 and 520 will be described in detail below. As the smoothing capacitors 510 and 520 have basically the same shape, the following description will be given using the smoothing capacitor 520 as an example.

Figure 4:
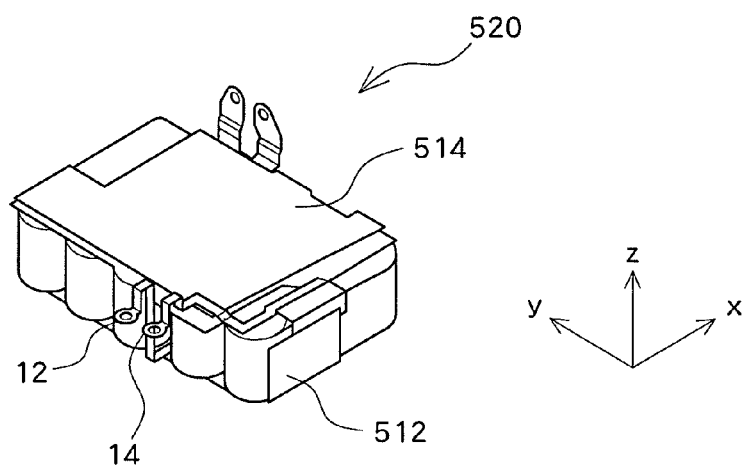
FIG. 4 shows a top perspective view of a capacitor of the embodiment.
Figure 5:
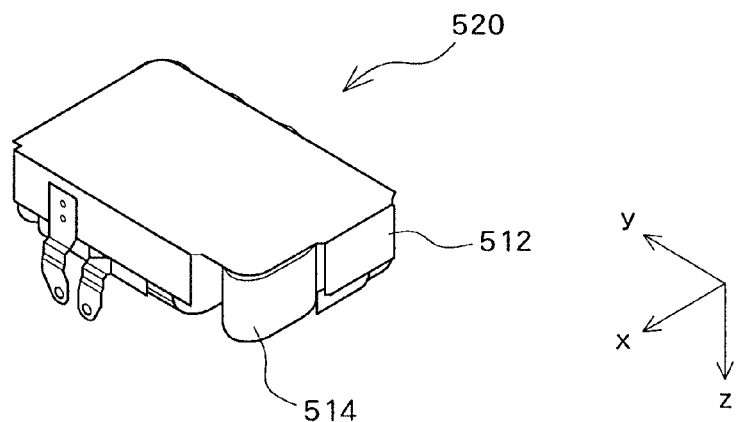
FIG. 5 shows a bottom perspective view of the capacitor of the embodiment.

FIG. 4 and FIG. 5 show upper perspective views of the smoothing capacitor 520. The smoothing capacitor 520 is composed of a plurality of capacitor elements, and a positive plate 512 and a negative plate 514 which are commonly used by the plurality of capacitor elements are arranged parallel to the x-y plane, assuming that three axes x-y-z are orthogonal to each other. A positive electrode terminal and a negative electrode terminal extend from the positive plate 512 and the negative electrode 512, respectively, and, in addition to these, a positive electrode bus bar 12 protrudes from the positive plate 512, and a negative electrode bus bar 14 protrudes from the negative plate 514.

Figure 6:
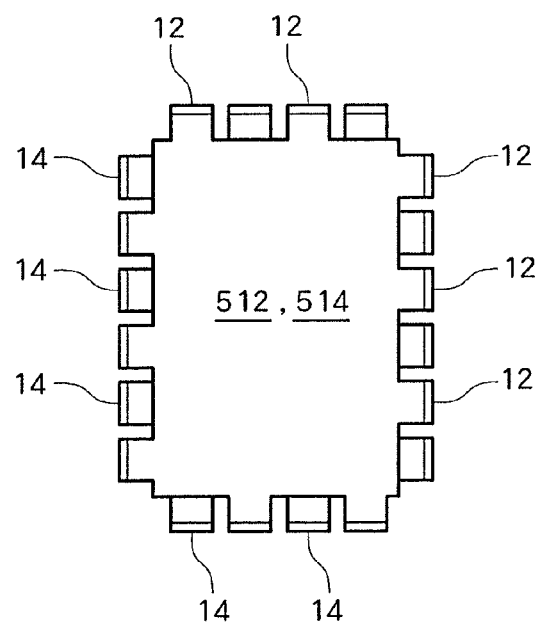
FIG. 6 shows a plan view of the capacitor of the embodiment.
Figure 7:
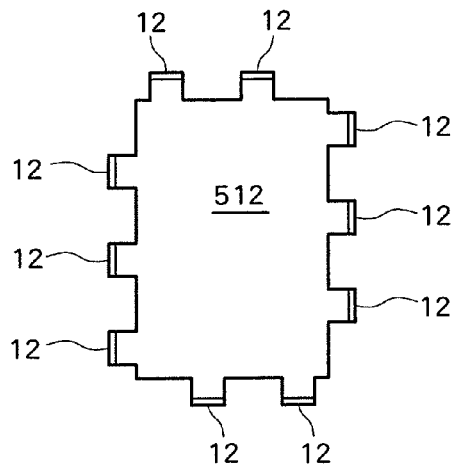
FIG. 7 shows a plan view of a positive plate of the capacitor of the embodiment.
Figure 8:
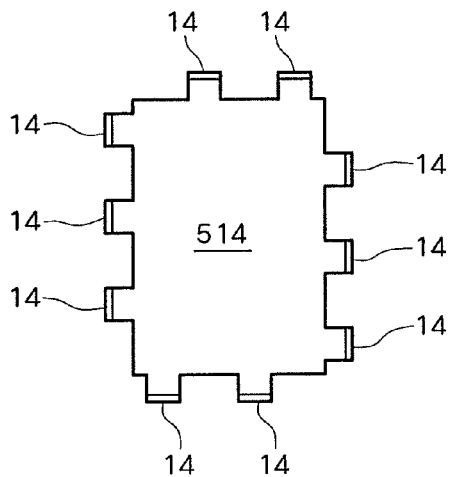
FIG. 8 shows a plan view of a negative plate of the capacitor of the embodiment.

FIG. 6 schematically shows a plan view of the smoothing capacitor 520. Further, FIG. 7 and FIG. 8 show plan views showing only the positive plate 512 and the negative plate 514, respectively. As shown in FIG. 7, a plurality of positive electrode bus bars 12 are formed to protrude around the entire periphery of the positive plate 512. In the figure, a planar shape of the positive plate 512 approximates a rectangle, and three positive electrode bus bars 12 are formed to protrude from the long side at regular intervals, while two positive electrode bus bars 12 are formed to protrude from the short side at regular intervals. Similarly, as shown in FIG. 8, a plurality of negative electrode bus bars 14 are formed to protrude around the entire periphery of the negative plate 514. A planar shape of the negative plate 514 approximates a rectangle, and three positive electrode bus bars 14 are formed to protrude from the long side at approximately regular intervals, while two negative electrode bus bars 14 are formed to protrude from the short side. However, when they are assembled as the smoothing capacitor 520, the positive electrode bus bars 12 and the negative electrode bus bars 14 are alternately arranged as shown in FIG. 6, and therefore, on the plane, the positions at which the negative electrode bus bars 14 are formed differ from the positions at which the positive electrode bus bars 12 are formed. For example, in terms of the three negative electrode bus bars 14 formed on the long side of the negative plate 514, the positions at which they are formed are respectively arranged between the three positive electrode bus bars 12 formed on the long side of the positive plate 512. The two negative electrode bus bars 14 formed on the short side of the negative plate 514 are arranged in a similar manner.

Although FIG. 4 and FIG. 5 show the capacitor in which the plurality of capacitor elements are arranged in the x-y plane, and the positive plate 512 and the negative plate 514 are arranged parallel to the x-y plane, the smoothing capacitor 520 is not, of course, limited to this configuration. Similarly, there may be also provided a capacitor in which the positive plate 512 and the negative plate 514 are arranged orthogonal to the x-y plane, and, in this case, again, a plurality of positive electrode bus bars 12 are formed to protrude from the entire periphery of the positive plate 512, and the negative electrode bus bars 14 are formed to protrude from the entire periphery.

Figure 9:
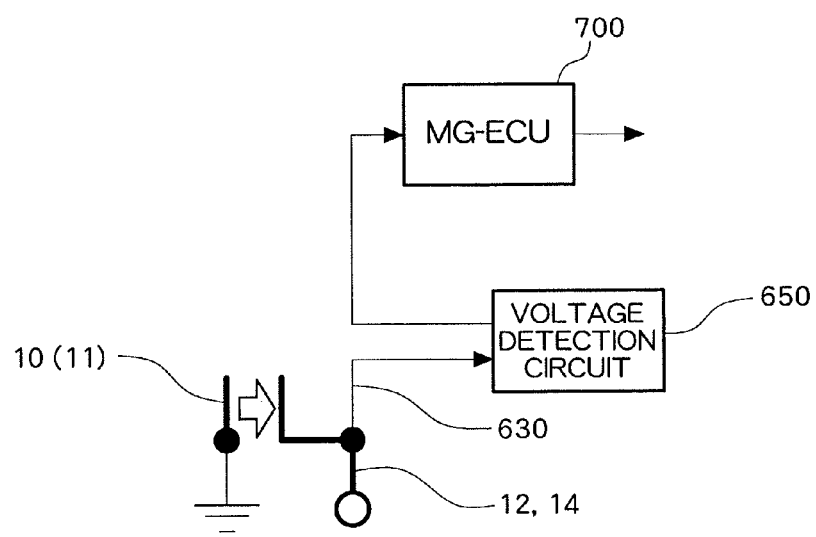
FIG. 9 shows a basic circuit diagram of a collision detection device.

FIG. 9 shows a basic circuit configuration of the collision detection device of the present embodiment. A voltage detection line 630 is connected to the positive electrode bus bar 12 and the negative electrode bus bar 14 that are arranged to extend close to the case 10; more particularly, to the flanges 11. An existing voltage detection line for detecting terminal voltage of the smoothing capacitor 520 can be used as the voltage detection line 630. This is one of the advantages obtained by forming, as collision detection means, the positive electrode bus bars 12 and the negative electrode bus bars 14 so as to protrude from the positive plate 512 and the negative plate 514, respectively.

The voltage detection line 630 which also functions as a detection line for detecting terminal voltage of the smoothing capacitor 520 is connected to a voltage detection circuit 650, and voltage of the positive electrode bus bars 12 and the negative electrode bus bars 14 is supplied to the voltage detection circuit 650.

The voltage detection circuit 650 converts the voltage of the positive electrode bus bars 12 and the negative electrode bus bars 14 into relatively low voltage and outputs the resulting voltage to the MG-ECU 700.

The MG-ECU 700 detects whether or not at least one of the positive electrode bus bars 12 or one of the negative electrode bus bars 14 contacts the flanges 11 of the case 10; more specifically, whether or not the vehicle has collided, based on change in voltage of the positive electrode bus bars 12 and the negative electrode bus bars 14 supplied from the voltage detection circuit 650. When detecting the collision of the vehicle, the MG-ECU 700 outputs an instruction to turn on the discharge circuit composed of the relay and the discharge resistor Rd shown in FIG. 1.

Figure 10:
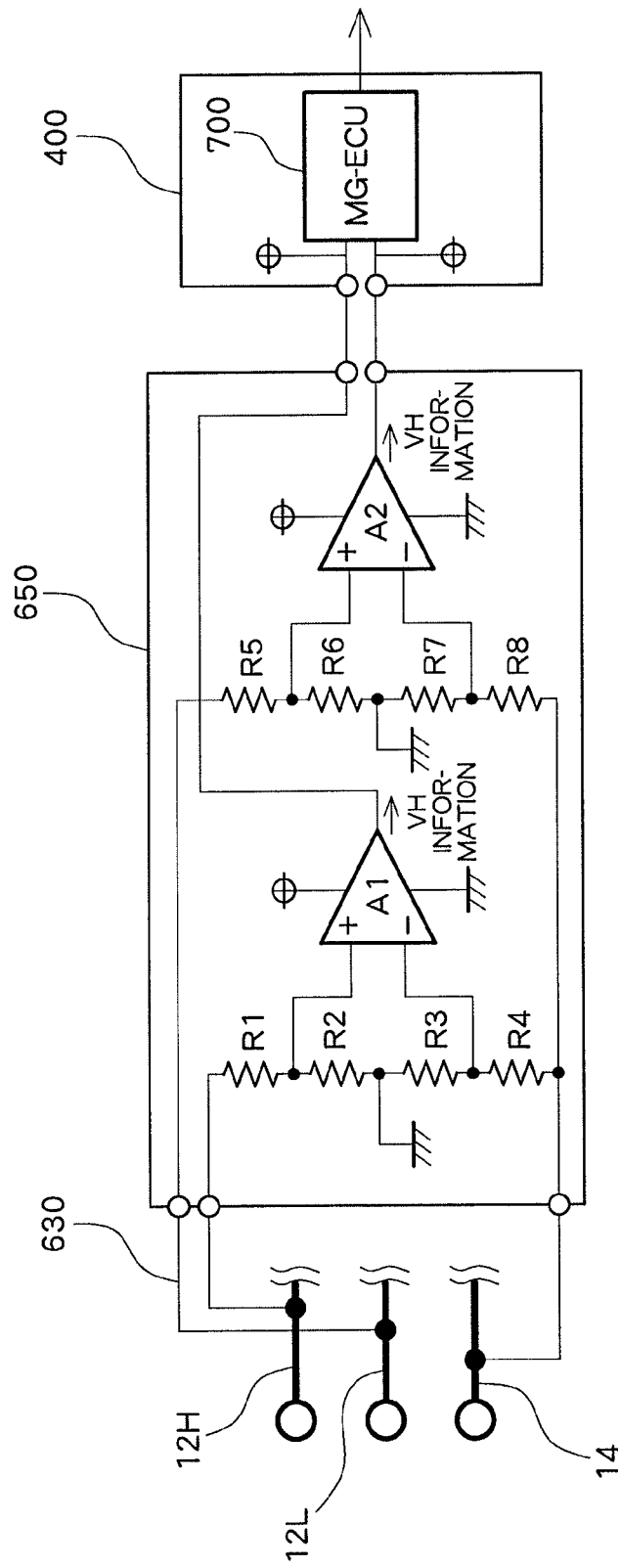
FIG. 10 shows a detailed circuit diagram of the collision detection device.

FIG. 10 shows a detailed circuit configuration of the collision detection circuit in the present embodiment. The positive plate of the smoothing capacitor 510 is connected to the VL line (see FIG. 1), and therefore, the positive electrode bus bar of the smoothing capacitor 510 is referred to as a positive electrode bus bar 12L. Further, the positive plate of the smoothing capacitor 520 is connected to the VH line (see FIG. 1), and therefore, the positive electrode bus bar of the smoothing capacitor 520 is referred to as a positive electrode bus bar 12H. Meanwhile, the negative plates of the smoothing capacitors 510 and 520 are both connected to the negative electrode line VN, and therefore, the negative electrode bus bars of the smoothing capacitor 510 and 520 are both referred to as negative electrode bus bars 14.

Voltage of the positive electrode bus bar 12L and the negative electrode bus bar 14 of the smoothing capacitor 510 and voltage of the positive electrode bus bar 12H and the negative electrode bus bar 14 of the smoothing capacitor 520 are supplied to the voltage detection circuit 650 via the voltage detection lines 630.

The voltage detection circuit 650 is a voltage conversion circuit for converting input voltage into a relatively low voltage, and has a high-voltage/low-voltage conversion circuit for converting voltage of the positive electrode bus bar 12L and voltage of the positive electrode bus bar 12H into relatively low voltage, respectively. The high-voltage/low-voltage conversion circuit is composed of a plurality of divided-voltage resistors connected in series to each other and a plurality of differential amplifiers. The voltage detection line 630 connected to the positive electrode bus bar 12H is connected to one end of the divided-voltage resistors R1, R2, R3, and R4 connected in series to each other. Further, the voltage detection line 630 connected to the negative electrode bus bar 14 is connected to another end of the divided-voltage resistors R1, R2, R3, and R4 connected in series to each other. A connection point between the divided-voltage resistors R1 and R2 is connected to a noninverting input terminal (+) of a differential amplifier A1, while a connection point between the divided-voltage resistors R3 and R4 is connected to an inverting input terminal (−) of the differential amplifier A1. The connection point between the divided-voltage resistors R3 and R4 is set at ground potential. The differential amplifier A1 is supplied with, for example, a voltage of 5V as control voltage, and converts the input voltage to lower voltage in a range with an upper limit of 5V and outputs the resulting voltage as VH information.

Similarly, the voltage detection line 630 connected to the positive electrode bus bar 12L is connected to one end of the divided-voltage resistors R5, R6, R7, and R8 connected in series to each other. Further, the voltage detection line 630 connected to the negative electrode bus bar 14 is connected to another end of the divided-voltage resistors R5, R6, R7, and R8 connected in series to each other. A connection point between the divided-voltage resistors R5 and R6 is connected to a noninverting input terminal (+) of a differential amplifier A2, while a connection point between the divided-voltage resistors R7 and R8 is connected to an inverting input terminal (−) of the differential amplifier A2. The connection point between the divided-voltage resistors R6 and R7 is set at ground potential. The differential amplifier A2 is supplied with, for example, a voltage of 5V as control voltage, and converts the input voltage to lower voltage in a range with an upper limit of 5V and outputs the resulting voltage as VL information. The VH information and the VL information are both supplied from the voltage detection circuit 650 to the MG-ECU 700 of the control board 400.

The MG-ECU 700 detects an occurrence of a collision based on the VH information and the VL information. More specifically, although, in a normal state, both VH information and VH information indicate that voltage is within a certain range, such as a range of 1V to 4V, when the line is disconnected due to a collision, the VH information and the VH information are both fixed to 5V, which is the control voltage, and therefore, the MG-ECU 700 detects that a collision has occurred. Further, when both VH information and VL information indicate 0V, this means that the positive electrode bus bars 12H and 12L are short-circuited with the negative electrode bus bars 14, and therefore, the MG-ECU 700 detects that a collision has occurred.

If only one of the positive electrode bus bars 12H and 12L contacts the flange 11 and has an earth fault, or if only the negative bus bar 14 contacts the flange 11 and has an earth fault, the voltage does not become 0V or 5V, but remains within a range of 1V-4V, and therefore, the MG-ECU 700 cannot detect an occurrence of an earth fault.

In consideration of this, there is added to the circuit in FIG. 10 a configuration in which two input signals from the differential amplifier circuit A1 and two input signals from the differential amplifier circuit A2 are all supplied to the MG-ECU 700. With this configuration, the MG-ECU 700 can directly recognize, in addition to the VH information and the VL information, voltage of the positive electrode bus bars 12H and 12L and voltage of the negative electrode bus bars 14, and therefore can detect an earth fault in any one of the bus bars. That is, if voltage of the positive electrode bus bar 12H is 0V, and if voltage of the negative electrode bus bar 14 is not 0V, the MG-ECU 700 can detect that the positive electrode bus bar 12H contacts the flange 11 and has an earth fault. Further, if voltage of the positive electrode bus bar 12L is 0V, and if voltage of the negative electrode bus bar 14 is not 0V, the MG-ECU 700 can detect that the positive electrode bus bar 12L contacts the flange 11 and has an earth fault. Still further, if voltages of the positive electrode bus bars 12H and 12L are not 0V, and if voltage of the negative electrode bus bar 14 is 0V, the MG-ECU 700 can detect that the negative electrode bus bar 14 contacts the flange 11 and has an earth fault. If voltages of the positive electrode bus bar 12H and voltage of the negative electrode bus bar 14 are both 0V; that is, if the positive electrode bus bar 12H and the negative electrode bus bar 14 both contact the flanges 11, the MG-ECU 700 detects this state as a short circuit.

Next, detection processing of the present embodiment will be described separately for the case where a short circuit caused by a collision on the positive electrode side and the negative electrode side is detected, and the case where both a short circuit and an earth fault caused by a collision on the positive electrode side and the negative electrode side are detected.

Figure 11:
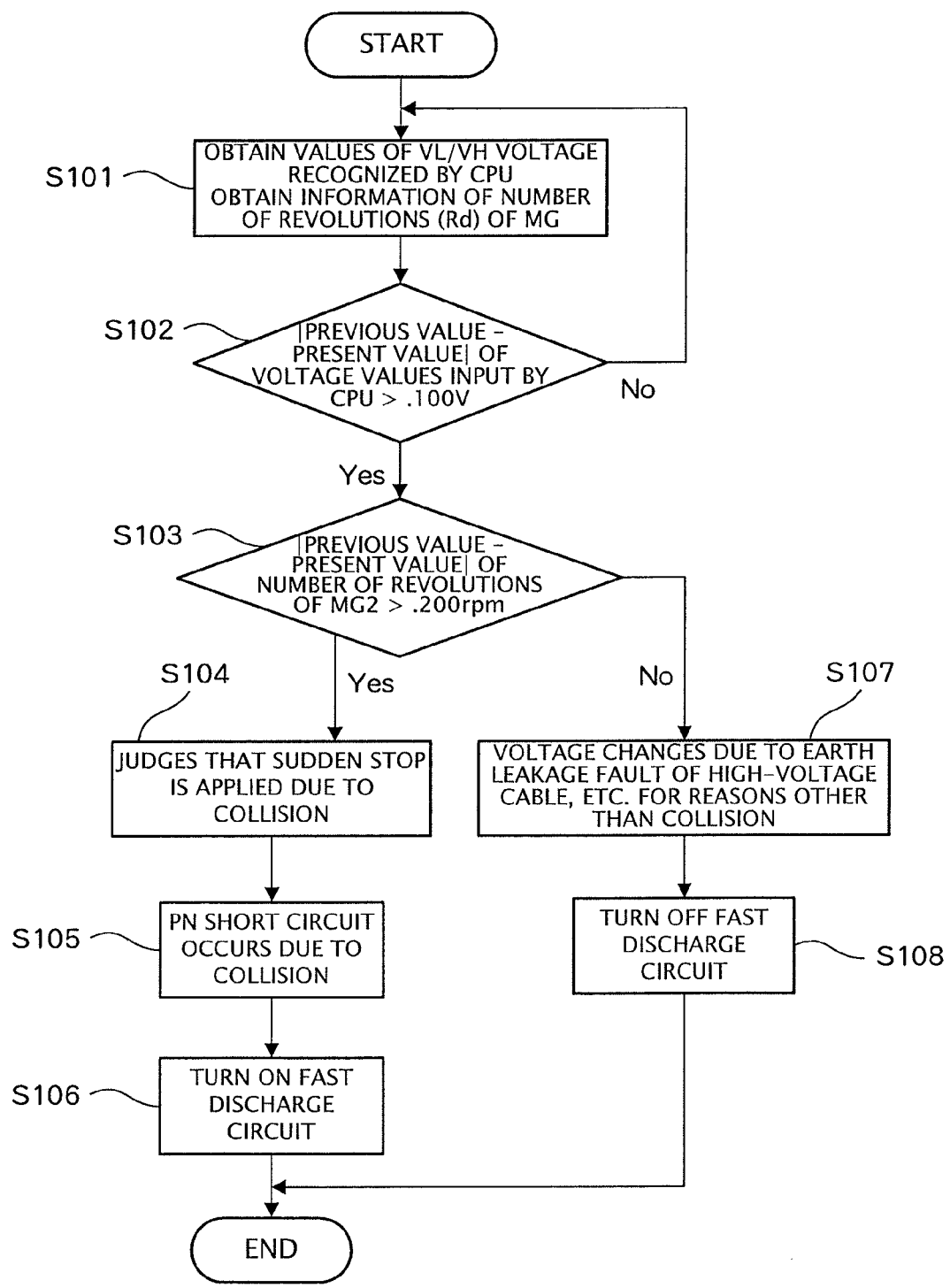
FIG. 11 shows a first process flowchart of the embodiment.

FIG. 11 shows a processing flowchart for detecting a short circuit in the positive electrode bus bar 12 and the negative electrode bus bar 14 caused by the collision.

First, a CPU of the MG-ECU 700 obtains the VH information and the VL information, and also obtains information of the number of revolutions (Rd) of a motor-generator (MG) 140 (S101).

Then, the CPU judges whether or not a difference (absolute value) between a previous value and a present value of the obtained VH information exceeds a threshold voltage of, for example, 100V in actual voltage (S102). Further, similarly, the CPU judges whether or not a difference (absolute value) between a previous value and a present value of the obtained VL information exceeds a threshold voltage. If the positive electrode bus bar 12H is short-circuited with the negative electrode bus bar 14, the difference value of the VH information exceeds the threshold voltage, and a judgment of YES is obtained. Further, similarly, if the positive electrode bus bar 12L is short-circuited with the negative electrode bus bar 14, the difference value of the VL information also exceeds the threshold voltage, and a judgment of YES is obtained. If the positive electrode bus bars 12H and 12L are not short-circuited with the negative electrode bus bar 14, there is no significant change between the previous value and the present value, a judgment of NO is obtained.

If a judgment of YES is obtained in S102; that is, if the difference value of the VH information or the VL information exceeds the threshold voltage, the CPU then judges whether or not a difference value of the number of revolutions Rd exceeds a threshold value of, for example, 200 rpm (S103). This judgment is a process for judging whether or not a sudden brake has been applied, and if a sudden brake has been applied, the number of revolutions Rd decreases rapidly. Therefore, the difference value exceeds the threshold value, and a judgment of YES is obtained.

Then, if a judgment of YES is obtained in S103; that is, if the difference value of the VH information or the VL information exceeds the threshold voltage, and if a sudden brake has been applied, the CPU recognizes that the sudden brake has been applied due to a collision (S104), detects that a PN short circuit has occurred due to the collision (S105), and outputs an instruction to turn on the fast discharge circuit composed of the relay and the discharge resistor, to thereby rapidly discharge the smoothing capacitors 510 and 520 (S106).

On the other hand, if a judgment of NO is obtained in S103; that is, if the difference value of the VH information or the VL information exceeds the threshold voltage, but there is no significant change in the number of revolutions and a sudden brake has not been applied, the CPU recognizes that voltage of a high-voltage cable, etc. has changed due to earth leakage fault for reasons other than a collision (S107), and does not perform collision detection and keeps the discharge circuit turned off (5108).

Although, in the present embodiment, collision detection is performed when the difference value of the VH information or the difference value of the VL information exceeds the threshold voltage, collision detection may also be performed when both of the difference value of the VH information and the difference value of the VL information exceed the threshold voltage.

Further, although, in the present embodiment, collision detection is performed when the difference value of the VH information or the difference value of the VL information exceeds the threshold voltage, collision detection may also be performed when the difference values of the VH information and the VL information are nearly zero.

Figure 12:
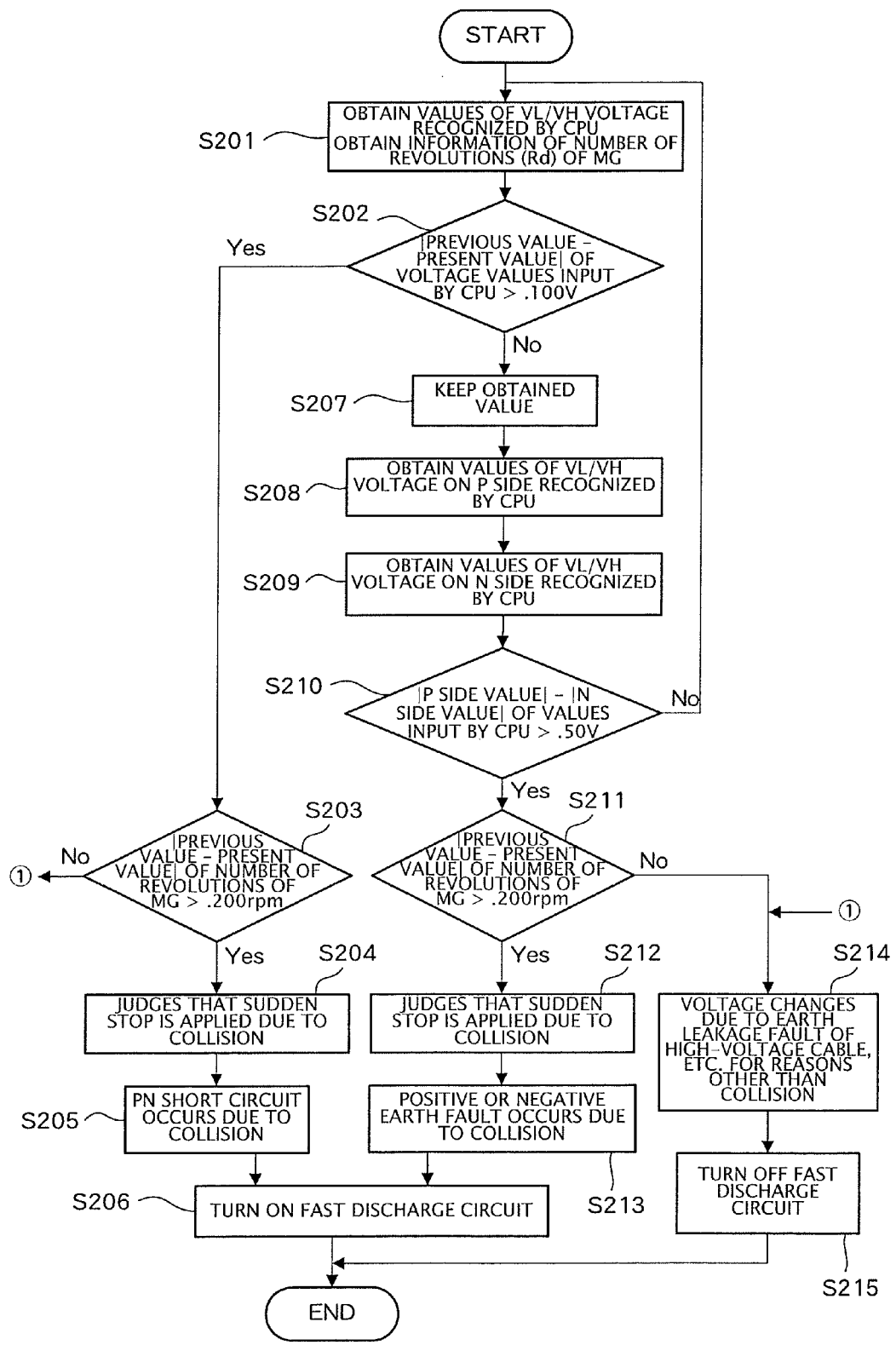
FIG. 12 shows a second process flowchart of the embodiment.

FIG. 12 shows a processing flowchart for detecting both a short circuit and an earth fault on the positive electrode side and the negative electrode side caused by a collision.

First, the CPU of the NG-ECU 700 obtains the VH and VL information and the information of the number of revolutions (Rd) of the motor-generator 140 (S201).

Then, the CPU judges whether or not a difference value between a previous value and a present value of the VH information or the VL information exceeds a threshold voltage of, for example, 100V in actual voltage (S202).

If it is judged YES in S202; that is, if the difference value of the VH information or the VL information exceeds the threshold voltage, the CPU judges whether or not the number of revolutions exceeds a threshold value of, for example, 200 rpm (S203), and if the number of revolutions exceeds the threshold value, recognizes that a sudden brake has been applied due to a collision (S204), detects that a PN short circuit has occurred due to the collision (S205), and turns on the fast discharge circuit, to thereby rapidly discharge the smoothing capacitors 510 and 520 (S206). The processing in S203 to 206 is identical to the processing in S103 to 5106 in FIG. 11. If a judgment of NO is obtained in S203; that is, if the number of revolutions does not exceed the threshold value, the processing will be carried out as described later.

On the other hand, if a judgment of NO is obtained in S202; that is, if the difference value of the VH information or the VL information does not exceed the threshold voltage, the CPU stores the presently-obtained value in a memory (S207); obtains, in addition to the VH information and the VL information, voltage of the positive electrode bus bars 12H and 12L and voltage of the negative electrode bus bar 14 (S208 and S209); and judges whether or not a difference value between them exceeds a threshold value of, for example, 50V in actual voltage (S210).

If a judgment of YES is obtained in S210; that is, if the voltage difference between the positive electrode bus bar 12H and the negative electrode bus bar 14 or the voltage difference between the positive electrode bus bar 12L and the negative electrode bus bar 14 exceeds the threshold value, the CPU further judges whether or not the difference value of the number of revolutions Rd exceeds a threshold value of, for example, 200 rpm (S211). Then, if the difference value of the number of revolutions exceeds the threshold value, the CPU recognizes that a sudden brake is applied due to a collision (S212), detects that a P or N short circuit has occurred due to the collision (S213), and outputs an instruction to turn on the fast discharge circuit, to thereby rapidly discharge the smoothing capacitors 510 and 520 (S206).

Further, if a judgment of NO is obtained in both S211 and S203, the CPU recognizes that voltage of a high-voltage cable, etc. has changed due to earth leakage fault for reasons other than a collision (S214) and keeps the discharge circuit turned off (S215).

Similar to FIG. 11, in FIG. 12, the CPU may also judge a PN short circuit based on the difference between the VH information and the VL information being nearly zero.

3. Variants

Figure 13:
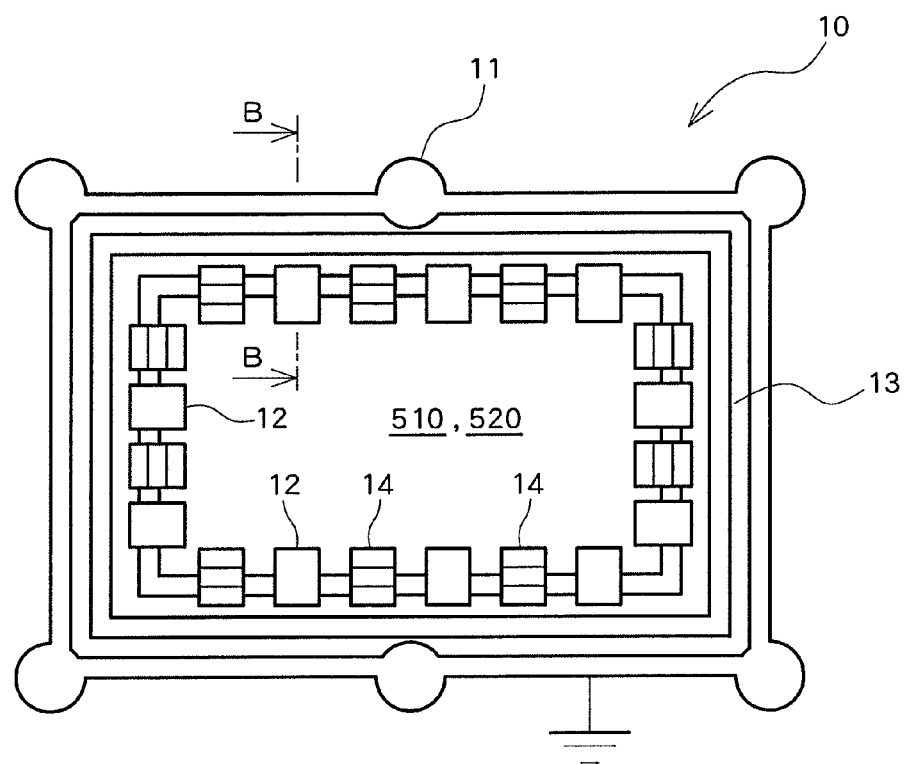
FIG. 13 shows a plan view of a case of another embodiment.
Figure 14:
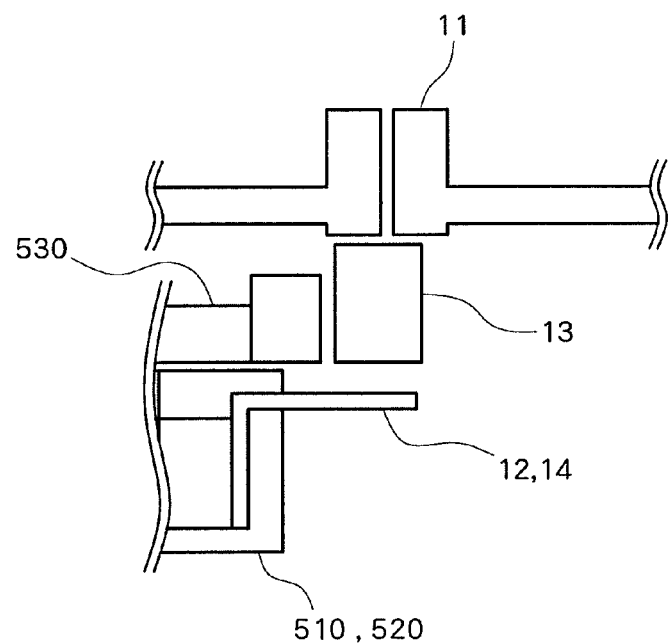
FIG. 14 shows a cross-sectional view of FIG. 13, taken along B-B.

FIG. 13 and FIG. 14 show a plan view of the case 10 according to another embodiment. FIG. 14 shows a cross-sectional view of FIG. 13, taken along B-B. In this embodiment, a metal frame 13 is located around the smoothing capacitors 510 and 520 so as to surround them. As shown in FIG. 14, the positive electrode bus bars 12 and the negative electrode bus bars 14 are formed to protrude from the positive plate and the negative plate of the smoothing capacitors 510 and 520 and extend close to the flanges 11 of the case 10, and the metal frame 13 is located between the flanges 11 and ends of the positive electrode bus bars 12 and the negative electrode bus bars 14.

In such a configuration, when the flanges 11 are deformed by an impact at the time of collision, the metal frame 13 is also deformed and contacts the positive electrode bus bars 12 and the negative electrode bus bars 14, resulting in occurrence of a short circuit or an earth fault. Therefore, occurrence of a collision can be detected by detecting a short circuit or an earth fault.

Further, although FIG. 4 to FIG. 8 show examples of the positive plates 512 and 514 of the smoothing capacitors 510 and 520, plates having shapes other than them may also be used.

Figure 15:
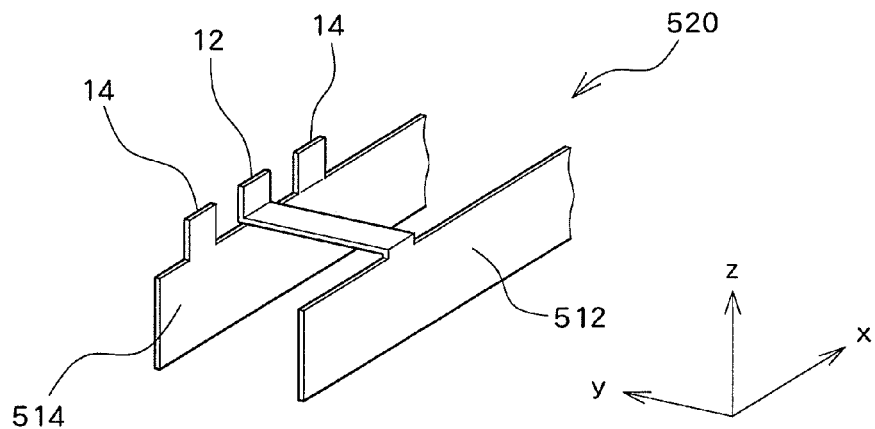
FIG. 15 shows a configuration diagram of a positive plate and a negative plate of a capacitor in still another embodiment.
Figure 16:
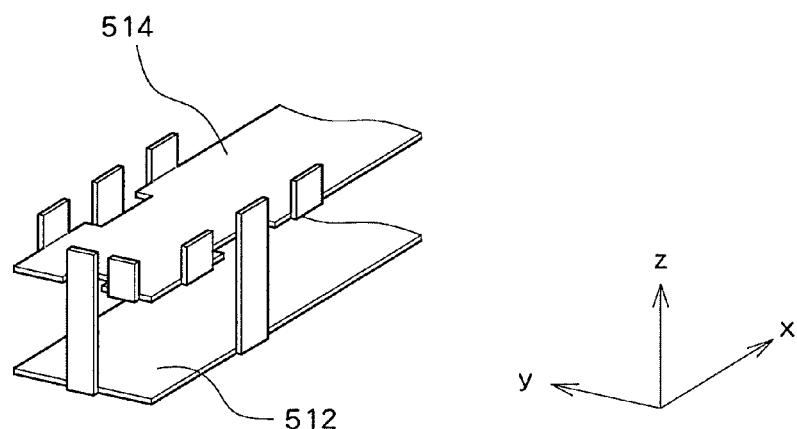
FIG. 16 shows a configuration diagram of a positive plate and a negative plate of a capacitor in yet another embodiment.

FIG. 15 and FIG. 16 show other configurations of the positive plate 512 and the negative plate 514 of the smoothing capacitor 520. In FIG. 15, the positive plate 512 and the negative plate 514 are arranged approximately orthogonal to the x-y plane, and the positive electrode bus bar 12 is formed to protrude from an end of the positive plate 512. The positive electrode bus bar 12 extends along the y direction from the positive plate 512 toward the negative plate 514 and is further formed to be curved in the z direction so that the end of the positive plate 512 exists on the same plane as the negative plate 514. Further, on the negative plate 514, the negative electrode bus bars 14 are formed at regular intervals so as to protrude along the z direction. The positive electrode bus bar 12 is located between the negative electrode bus bars 14.

Further, in FIG. 16, the positive plate 512 and the negative plate 514 are arranged approximately parallel to the x-y plane, and the positive electrode bus bars 12 are formed to protrude from an end of the positive plate 512. The positive electrode bus bars 12 extend from the positive plate 512 to the negative plate 514 along the z direction. Further, on the negative plate 514, the negative electrode bus bars 14 are formed at regular intervals so as to protrude along the z direction. The positive electrode bus bars 12 are located between the negative electrode bus bars 14.

Figure 17:
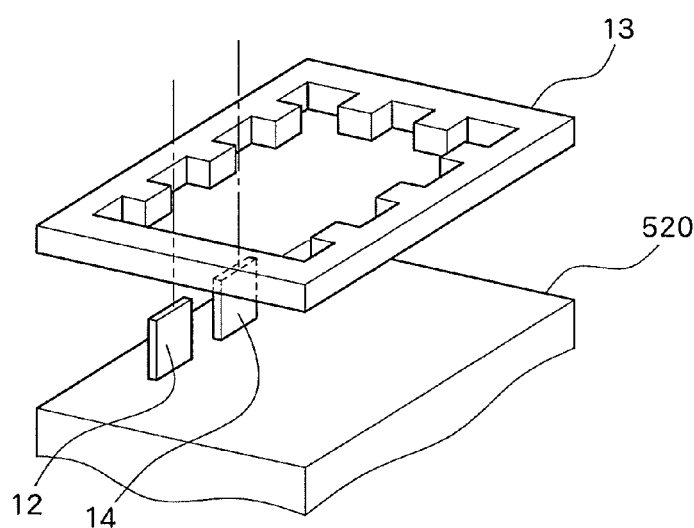
FIG. 17 shows a configuration diagram of a capacitor in still another embodiment.

Further, in the configuration in which the metal frame 13 is located so as to surround the smoothing capacitors 510 and 520, protrusions and recesses may also be formed on the inner surface side of the metal frame 13 as shown in FIG. 17, and the positive electrode bus bars 12 and the negative electrode bus bars 14 may be inserted into the recesses of these protrusions and recesses.

Figure 18:
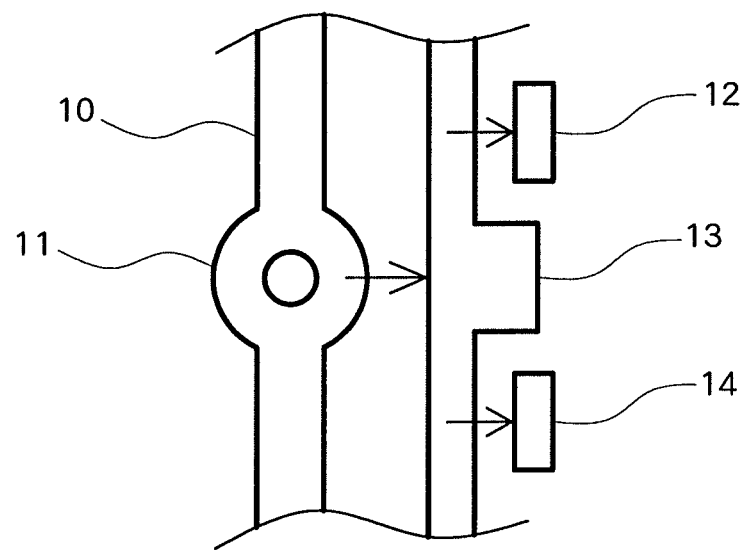
FIG. 18 shows a plan view showing a positional relationship between a metal frame and electrode bus bars in FIG. 17.
Figure 19:
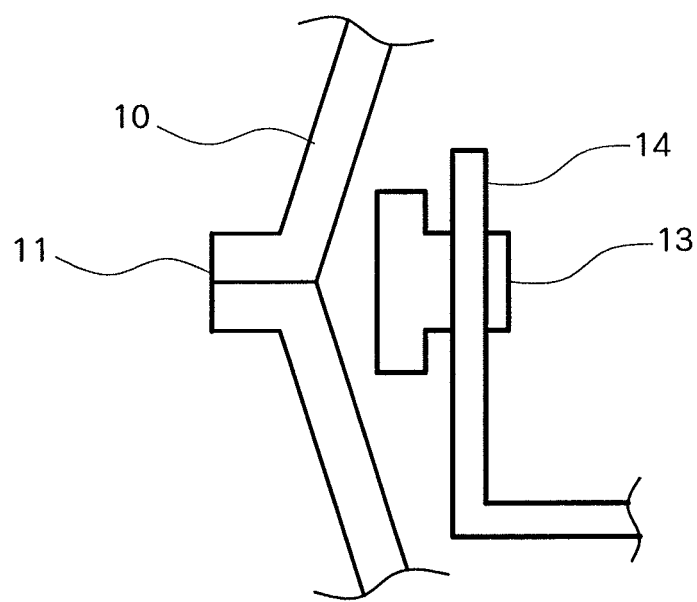
FIG. 19 shows a side view showing a positional relationship between the metal frame and the electrode bus bars in FIG. 17.

FIG. 18 and FIG. 19 show a relationship between the metal frame 13 and the positive electrode bus bar 12 and the negative electrode bus bar 14 in the configuration of FIG. 17 at the time of collision. FIG. 18 is a plan view, while FIG. 19 is a side view. The protrusions and recesses are formed on the inner surface of the metal frame 13, and the positive electrode bus bars 12 and the negative electrode bus bars 14 are alternately inserted into adjacent recesses. In a normal state, the flanges 11 of the case 10 and the metal frame 13 are separated from each other, and the metal frame 13 is separated from the positive electrode bus bars 12 and the negative electrode bus bars 14. When a collision occurs, the flanges 11 are deformed and moved by an impact at the time of collision and contact the metal frame 13. Further, the metal frame 13 is deformed and moved and contacts the positive electrode bus bar 12 or the negative electrode bus bar 14. When the metal frame 13 contacts the positive electrode bus bar 12 and the negative electrode bus bar 14, a PN short circuit occurs. Further, when the metal frame 13 contacts the positive electrode bus bar 12 or the negative electrode bus bar 14, an earth fault in P or N occurs.

Figure 20:
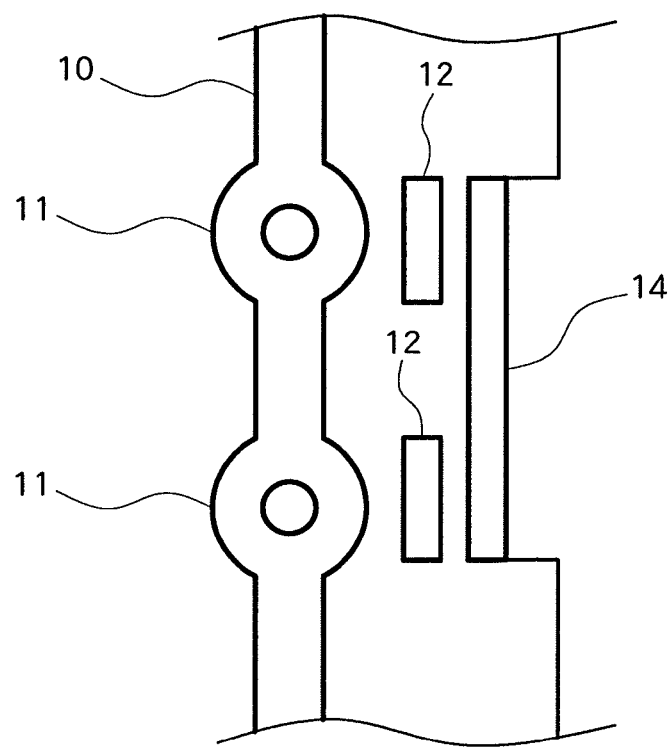
FIG. 20 shows a plan view showing a positional relationship between a case and electrode bus bars in still another embodiment.
Figure 21:
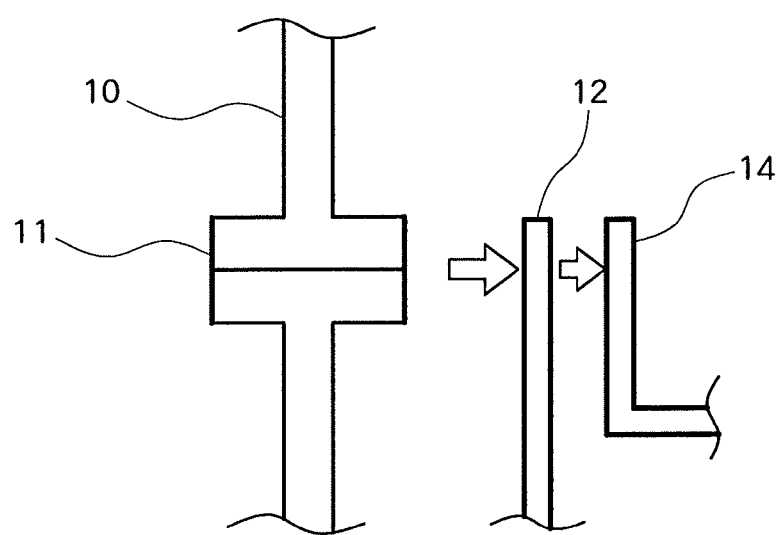
FIG. 21 shows a side view showing a positional relationship between the case and the electrode bus bars in FIG. 20.
Figure 22:
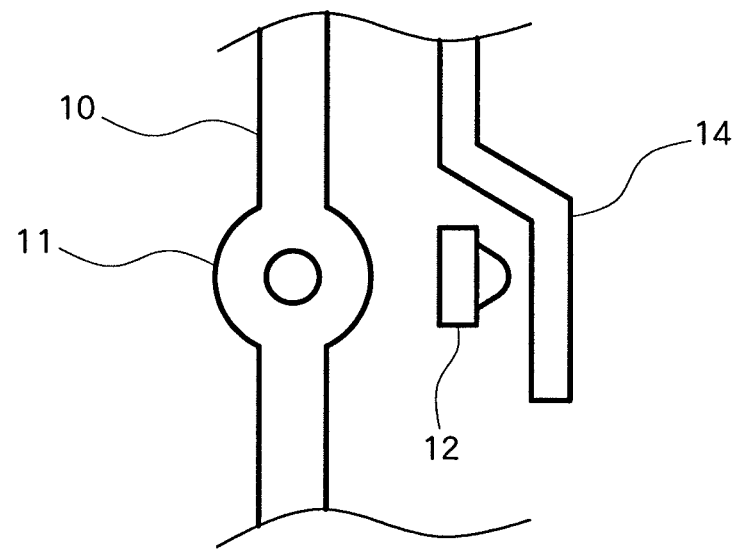
FIG. 22 shows a plan view showing a positional relationship between a case and electrode bus bars in still another embodiment.
Figure 23:
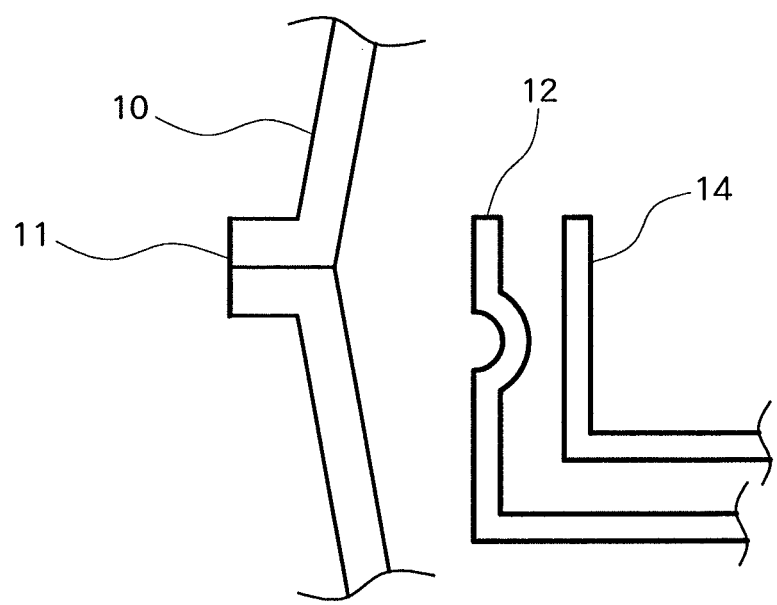
FIG. 23 shows a side view showing a positional relationship between the case and the electrode bus bars in FIG. 22.

Further, although, in FIG. 2 and FIG. 13, the positive electrode bus bars 12 and the negative electrode bus bars 14 are arranged along a direction approximately parallel to the inner surface of the case 10, and the positive electrode bus bars 12 and the negative electrode bus bars 14 have approximately the same distance from the case 10, the positive electrode bus bars 12 may be located between the case 10 and the negative electrode bus bars 14, as shown in the plane view in FIG. 20 and the side view in FIG. 21. That is, the positive electrode bus bars 12 and the negative electrode bus bars 14 may also be arranged along a direction approximately orthogonal to the inner surface of the case 10. In this case, when a collision occurs, the flanges 11 of the case 10 are deformed and moved and contact the positive electrode bus bar 12, and the positive electrode bus bar 12 contact the negative electrode bus bar 14. The plan view in FIG. 22 and the side view in FIG. 23 both show the configuration in which the positive electrode bus bar 12 is located between the case 10 and the negative electrode bus bar 14, and, in this configuration, a protrusion is formed on a surface of the positive electrode bus bar 12 which faces the negative electrode bus bar 14 so that the positive electrode bus bar 12 easily contacts the negative electrode bus bar 14 by an impact at the time of collision. Further, although, in the present embodiment, the positive electrode bus bars 12 and the negative electrode bus bars 14 are formed to respectively protrude from the positive plate 512 and the negative plate 514 of the smoothing capacitors 510 and 520, such that they protrude from the periphery of the smoothing capacitors 512 and 514, a collision may be detected by forming only the positive electrode bus bars 12 so as to protrude from the positive plate 512 and detecting an earth fault only in the positive electrode bus bars 12. Similarly, a collision may be detected by forming only the negative electrode bus bars 14 so as to protrude from the negative plate 514 and detecting an earth fault only in the negative electrode bus bars 14.

REFERENCE SYMBOLS LIST 12 positive electrode bus bar, 14 negative electrode bus bar, 400 control board, 510, 520 smoothing capacitor, 512 positive plate, 514 negative plate, 600 ECU, 700 MG-ECU.

The invention claimed is:

1. A collision detection device for a vehicle, the device comprising:
    a capacitor;
    a case which contains the capacitor;
    electrode bus bars which are connected to electrode plates of the capacitor and protrude from a periphery of the capacitor to face an inner surface of the case; and
    a control unit which detects a voltage change in the electrode bus bars, thereby detecting a collision, wherein said electrode plates include a positive plate and a negative plate.

2. The collision detection device for the vehicle according to claim 1, wherein the electrode bus bars are connected to at least one of said positive plate and said negative plate of the capacitor.

3. The collision detection device for the vehicle according to claim 1, further comprising a metal frame which is contained in the case and surrounds the periphery of the capacitor, wherein the electrode bus bars face the inner surface of the case with the metal frame therebetween.

4. The collision detection device for the vehicle according to claim 3, wherein:
    the electrode bus bars are connected to the positive plate and the negative plate of the capacitor; and
    the control unit detects a collision by detecting a voltage change due to contact between the electrode bus bar connected to the positive plate and the electrode bus bar connected to the negative plate, and the metal frame.

5. The collision detection device for the vehicle according to claim 3, wherein:
    the electrode bus bars are connected to one of the positive plate and the negative plate of the capacitor; and
    the control unit detects a collision by detecting a voltage change due to contact between the electrode bus bars connected to the positive plate or the electrode bus bars connected to the negative plate and the metal frame.

6. The collision detection device for the vehicle according to claim 1, wherein the electrode bus bars face the inner surface of the case on the same plane as a flange formed on the case.

7. The collision detection device for the vehicle according to claim 1, further comprising a voltage detection line which supplies terminal voltage of the capacitor to the control unit, wherein the voltage detection line supplies voltage of the electrode bus bars to the control unit.

8. The collision detection device for the vehicle according to claim 1, wherein:
    the electrode bus bars are connected to the positive plate and the negative plate of the capacitor; and
    the control unit detects a collision by detecting a voltage change due to a short circuit between the electrode bus bars connected to the positive plate and the electrode bus bars connected to the negative plate.

9. The collision detection device for the vehicle according to claim 1, wherein:
    the electrode bus bars are connected to one of the positive plate and the negative plate of the capacitor; and
    the control unit detects a collision by detecting a voltage change due to an earth fault in the electrode bus bars connected to the positive plate or the electrode bus bars connected to the negative plate.

10. The collision detection device for the vehicle according to claim 1, wherein:
    the electrode bus bars are connected to the positive plate and the negative plate of the capacitor; and
    the electrode bus bars connected to the positive plate and the electrode bus bars connected to the negative plate are both arranged in a direction approximately parallel to the inner surface of the case.

11. The collision detection device for the vehicle according to claim 1, wherein:
    the electrode bus bars are connected to the positive plate and the negative plate of the capacitor; and
    the electrode bus bars connected to the positive plate and the electrode bus bars connected to the negative plate are both arranged in a direction approximately orthogonal to the inner surface of the case.

* * * * *